(12) United States Patent
Janardhanan et al.

(10) Patent No.: US 10,498,344 B2
(45) Date of Patent: Dec. 3, 2019

(54) PHASE CANCELLATION IN A PHASE-LOCKED LOOP

(71) Applicant: TEXAS INSTRUMENTS INCORPORATED, Dallas, TX (US)

(72) Inventors: Jayawardan Janardhanan, Issaquah, WA (US); Christopher Andrew Schell, Tacoma, WA (US); Arvind Sridhar, Issaquah, WA (US); Sinjeet Dhanvantray Parekh, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/233,283

(22) Filed: Dec. 27, 2018

(65) Prior Publication Data

US 2019/0280699 A1   Sep. 12, 2019

Related U.S. Application Data

(60) Provisional application No. 62/640,607, filed on Mar. 9, 2018.

(51) Int. Cl.
  *H03L 7/093* (2006.01)
  *H03L 7/14* (2006.01)
  *H03L 7/087* (2006.01)
  *H03L 7/083* (2006.01)

(52) U.S. Cl.
  CPC .............. *H03L 7/093* (2013.01); *H03L 7/083* (2013.01); *H03L 7/087* (2013.01); *H03L 7/148* (2013.01)

(58) Field of Classification Search
  CPC ......... H03L 7/148; H03L 7/093; H03L 7/083; H03L 7/087

USPC .......... 327/156, 158, 161; 375/371, 375, 376
  See application file for complete search history.

(56) References Cited

U.S. PATENT DOCUMENTS

| 5,200,933 | A  | 4/1993  | Thornton et al. |
| 5,304,954 | A  | 4/1994  | Saito et al. |
| 5,796,682 | A  | 8/1998  | Swapp |
| 5,959,502 | A  | 9/1999  | Ovens et al. |
| 6,308,055 | B1 | 10/2001 | Welland et al. |

(Continued)

FOREIGN PATENT DOCUMENTS

| EP | 0644657 | 3/1995 |
| EP | 3182592 | 6/2017 |

(Continued)

OTHER PUBLICATIONS

International Search Report in corresponding PCT Application No. PCT/US2019/021599 dated May 30, 2019 (2 pages).

(Continued)

*Primary Examiner* — John W Poos
(74) *Attorney, Agent, or Firm* — John R. Pessetto; Charles A. Brill; Frank D. Cimino

(57) ABSTRACT

A phase-locked loop (PLL) including a multiplexer with multiple inputs, each input coupled to receive a different reference clock. A time-to-digital converter (TDC) generates a TDC output value based on a phase difference between a reference clock from the multiplexer and a feedback clock. An averager circuit coupled to an output of the TDC. An adder circuit is coupled to outputs of the TDC and the averager circuit. A loop filter is coupled to an output of the adder circuit.

11 Claims, 3 Drawing Sheets

(56) References Cited

U.S. PATENT DOCUMENTS

| | | |
|---|---|---|
| 6,310,653 B1 | 10/2001 | Malcolm, Jr. et al. |
| 6,584,574 B1 | 6/2003 | Embree |
| 6,597,249 B2 | 7/2003 | Chien et al. |
| 7,126,429 B2 | 10/2006 | Mitric |
| 7,755,439 B2 | 7/2010 | Yu et al. |
| 7,876,136 B2 | 1/2011 | Ha et al. |
| 8,179,174 B2 | 5/2012 | Bunch |
| 8,368,438 B2 | 2/2013 | Furuta |
| 8,957,711 B2 | 2/2015 | Jin et al. |
| 9,020,089 B2 | 4/2015 | Da Dalt |
| 9,490,820 B2 | 11/2016 | Shiozaki |
| 9,634,826 B1 | 4/2017 | Park et al. |
| 9,859,901 B1 | 1/2018 | Chu et al. |
| 10,075,173 B2 * | 9/2018 | Sarda ............... H03L 7/093 |
| 10,128,858 B2 | 11/2018 | Goldberg et al. |
| 10,135,452 B2 | 11/2018 | Cherniak et al. |
| 10,141,941 B2 | 11/2018 | Petrov |
| 10,185,349 B2 | 1/2019 | Musunuri et al. |
| 10,193,561 B2 | 1/2019 | Lesso |
| 10,200,047 B2 | 2/2019 | Markulic et al. |
| 10,291,214 B2 | 5/2019 | Thijssen et al. |
| 2007/0085570 A1 | 4/2007 | Matsuta |
| 2009/0015338 A1 | 1/2009 | Frey |
| 2009/0219073 A1 | 9/2009 | Sun et al. |
| 2009/0267664 A1 | 10/2009 | Uozumi et al. |
| 2011/0234270 A1 | 9/2011 | Kobayashi |
| 2011/0273210 A1 * | 11/2011 | Nagaraj ............... H03L 7/0802 327/159 |
| 2012/0056769 A1 | 3/2012 | Wang et al. |
| 2012/0161834 A1 | 6/2012 | Lee et al. |
| 2013/0051290 A1 | 2/2013 | Endo et al. |
| 2014/0225653 A1 | 8/2014 | Hara et al. |
| 2014/0266351 A1 | 9/2014 | Na et al. |
| 2014/0266354 A1 | 9/2014 | Boo et al. |
| 2015/0077279 A1 | 3/2015 | Song et al. |
| 2015/0188553 A1 | 7/2015 | Familia et al. |
| 2015/0372690 A1 | 12/2015 | Tertinek et al. |
| 2016/0056827 A1 | 2/2016 | Vlachoginnakis et al. |
| 2016/0156362 A1 | 6/2016 | Kim et al. |
| 2016/0164532 A1 | 6/2016 | Zhang et al. |
| 2016/0204787 A1 | 7/2016 | Lotfy |
| 2016/0238998 A1 | 8/2016 | Pavlovic et al. |
| 2016/0352506 A1 | 12/2016 | Huang |
| 2016/0380759 A1 | 12/2016 | Kondo et al. |
| 2017/0187383 A1 | 6/2017 | Lesso |
| 2017/0288686 A1 | 7/2017 | Burg et al. |
| 2018/0269885 A1 | 9/2018 | Kondo et al. |
| 2018/0351558 A1 | 12/2018 | Kuo et al. |

FOREIGN PATENT DOCUMENTS

| | | |
|---|---|---|
| JP | H11143570 | 5/1999 |
| JP | 2009260866 | 11/2009 |
| WO | 2015161890 | 10/2015 |

OTHER PUBLICATIONS

Michael H. Perrott, "Tutorial on Digital Phase-Locked Loops;" CICC 2009. Sep. 2009 (118 pgs).

Texas Instruments Data Sheet LMK05028 Low-Jitter Dual-Channel Network Synchronizer Clock with EEPROM, Feb. 2018 (94 pages).

International Search Report in corresponding PCT Application No. PCT/US2019/030892 dated Aug. 1, 2019 (3 pages).

International Search Report in corresponding PCT Application No. PCT/US2019/021968 dated Jun. 13, 2019 (2 pages).

International Search Report in corresponding PCT Application No. PCT/US2019/021966 dated Jun. 20, 2019 (2 pages).

* cited by examiner

PHASE CANCELLATION IN A PHASE-LOCKED LOOP

RELATED APPLICATIONS

This application claims priority to U.S. Provisional Application No. 62/640,607, filed Mar. 9, 2018, which is hereby incorporated by reference.

BACKGROUND

A phase-locked loop (PLL) generates an output dock that the PLL phase locks to an input reference dock. A digital PLL (DPLL) includes a time-to-digital converter (TDC) that generates a digital output value that is a function of the phase difference between corresponding edges of the reference dock and a feedback dock derived from the output clock. Based on the digital signal from the TDC, the output clock frequency from a voltage-controlled oscillator is adjusted to maintain phase lock.

SUMMARY

In one example, a phase-locked loop (PLL) including a multiplexer with multiple inputs, each input coupled to receive a different reference clock. A time-to-digital converter (TDC) generates a TDC output value based on a phase difference between a reference clock from the multiplexer and a feedback clock. An averager circuit coupled to an output of the TDC. An adder circuit is coupled to outputs of the TDC and the averager circuit. A loop filter is coupled to an output of the adder circuit.

In another example, a method includes causing a frequency control word output from a digital loop filter to remain fixed and changing an input to a time-to-digital converter (TDC) from a first reference clock to a second reference clock. The method further includes determining an average of output values from the TDC to generate an average value, generating a second value based on the average value and the current TDC output values, and causing the digital loop filter to dynamically generate new frequency control words based on the second value.

BRIEF DESCRIPTION OF THE DRAWINGS

For a detailed description of various examples, reference will now be made to the accompanying drawings in which.

DETAILED DESCRIPTION

Some PLL implementations permit multiple reference clocks to be provided to the PLL. A multiplexer receives the multiple reference clocks and, based on a control signal, provides one of the reference clocks to the PLL core. The PLL core then phase locks an output clock to the selected reference clock. Based on the needs of a given application, the currently selected reference clock being detected to be invalid, for other reasons, the control signal to the multiplexer can be asserted to cause the multiplexer to select a different reference clock to provide to the PLL core. The various possible reference clocks provided to the multiplexer may not be phase-aligned between themselves. Thus, when switching from one reference clock to another reference clock, the PLL's output clock may suddenly experience a frequency and/or phase change, which may disrupt the operation of the circuit that is using the PLL's output clock. For example, packets may be corrupted or dropped in a communication transceiver that uses a PLL with multiple selectable reference clock inputs.

The PLL described herein avoids a sudden frequency and phase shift in the PLL's output upon switching to a different reference clock. The disclosed PLL includes a circuit between the output of the TDC and the input of a digital loop filter that forces the input to the digital loop filter to be approximately equal to zero upon changing to a new reference clock. At the same time, the frequency control word output of the digital loop filter is temporarily frozen. Freezing the digital loop filter means that the frequency control word is maintained at the frequency control word that was being generated when the PLL initiated the change to a new reference clock. Freezing the digital loop filter causes the PLL's output clock to maintain its same frequency and phase. The TDC, at this point, receives the new reference clock as well as the unchanged output clock and determines the phase difference between the new reference clock and the output clock which was previously phase locked to the former reference clock. The circuit disposed between the TDC and the digital loop filter includes an averager circuit that averages the newly generated values from the TDC (with the new reference clock) for a predetermined period of time and then stores the average value. An adder circuit then subtracts the average value from each newly generated TDC output value. The digital loop filter is then released from its frozen state to dynamically continue generating new frequency control words based on the output value from the adder circuit, which will be approximately zero. Because the adder circuit's output to the digital loop filter is approximately zero upon a change to a different reference clock with a possibly arbitrary phase difference with respect to the previously used reference clock, the output clock from the PLL will not experience much, if any, frequency or phase shift.

Figures 1, 2, 3:
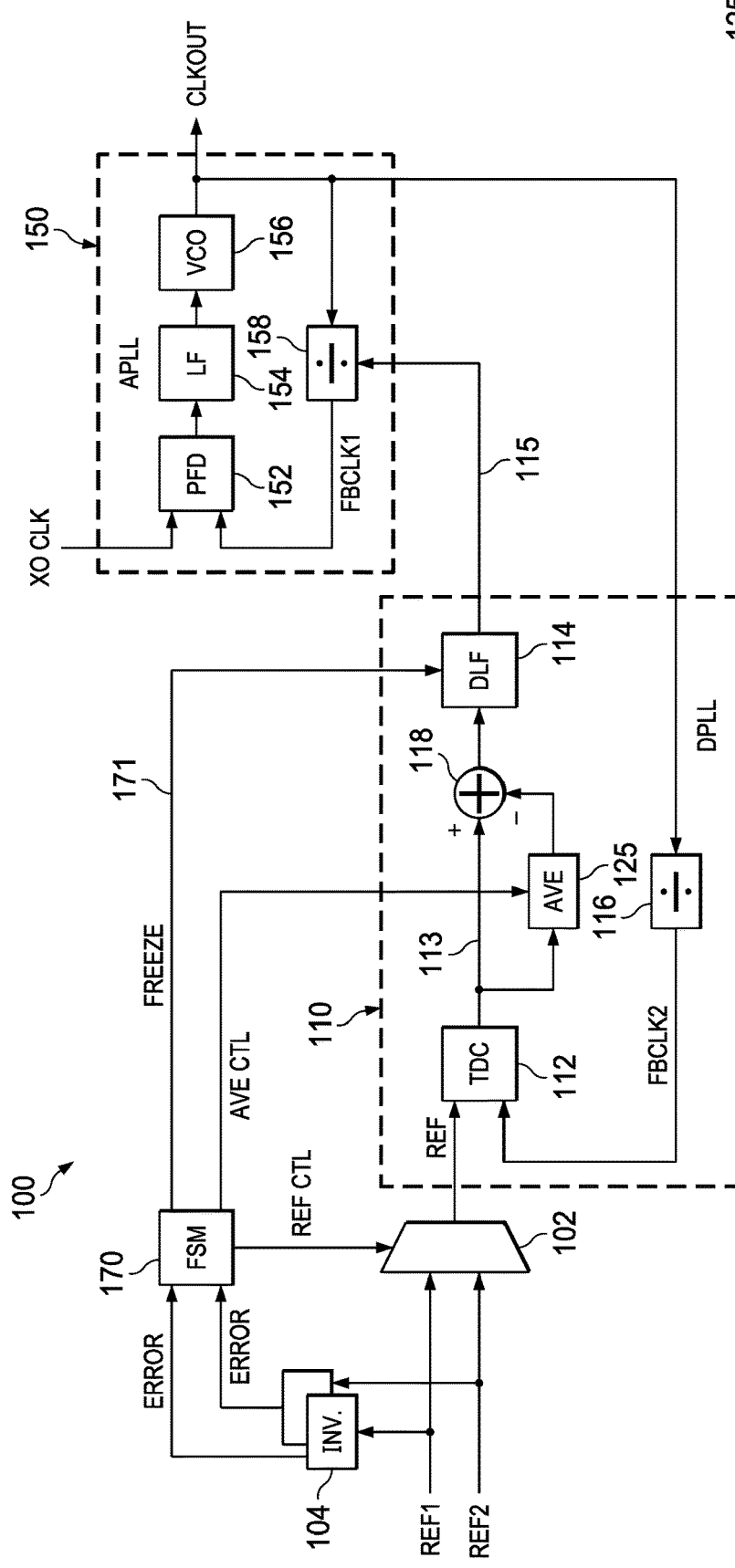
FIG. 1 illustrates an example of a PLL which avoids frequency and/or phase shift of its output clock upon changing to a new reference clock.
FIG. 2 shows an example of digital loop filter used in the PLL of FIG. 1 where the digital loop filter can be temporarily frozen upon changing to a new reference clock.
FIG. 3 shows an example implementation of an adder circuit usable in the PLL of FIG. 1 to average the output values from a time-to-digital converter within the PLL.

FIG. 1 includes a schematic of an example PLL 100. PLL 100 in this example includes a finite state machine (FSM) 170, a DPLL 110 coupled to an APLL 150. The PLL 100 also includes an input multiplexer 102 which has multiple inputs, each input capable of receiving a different reference clock. Two reference clocks (REF1 and REF2) are shown in the example of FIG. 1, but more than two reference clocks can be provided to the multiplexer 102, or if only a single reference clock is needed for a given application, then only one reference clock is provided (in which case the aforementioned problems that could occur with a change in reference clocks is inapplicable).

The example of FIG. 1 includes clock invalidity detector circuits 104. Each clock invalidity detector circuit 104 determines whether an input reference clock is valid or invalid and asserts an error signal (ERROR) to the FSM 170 to indicate the validity/invalidity status of the corresponding reference clock. Upon determining that the currently selected reference clock is invalid, the FSM 170 asserts a reference clock control signal (REF CTL) to the multiplexer 102 to change the PLL to a different reference clock. For example, if REF1 is currently being provided through multiplexer 102 to the TDC 112 (discussed below), the FSM 170 will cause the multiplexer 102 to switch to REF2 upon receiving an error signal that REF1 is invalid. An invalid reference clock may refer to reference clock whose period suddenly changes by more than a threshold amount. An edge of the reference clock being too early (relative to reference time period), too late (relative to a reference time period), or missing altogether is indicative of an invalid reference clock.

In the example of FIG. 1, switching between reference clocks occurs on the basis of the detection that the currently used reference clock is invalid. In other examples, the REF CTL signal to the multiplexer is an externally-supplied signal (external to the semiconductor die containing the PLL) and may be asserted due to a change in application parameters, and not necessarily because the currently used reference clock becomes corrupted. Regardless of the reason for changing reference clocks, the PLL 100 avoids the frequency and phase change that would otherwise have occurred upon a change to a reference with a different phase than the previous reference clock.

Referring still to FIG. 1, the DPLL 110 includes a TDC 112, a digital loop filter (DLF) 114, and a frequency divider 116. The APLL includes a phase-frequency detector (PFD) 152, a loop filter (LF) 154, a voltage-controlled oscillator (VCO) 156, and a programmable frequency divider 158. Additional components may be included as well in other examples. The PFD 152 of the APLL 150 detects the phase and/or frequency difference between an XO CLK and a feedback clock (FBCLK1). FBCLK1 is generated by the programmable frequency divider 158 and is a divided down version of the output clock (CLKOUT) from the VCO 156. The PFD 152 generates and output control signal to the LP 154 based on the phase and/or frequency difference. The LP 154 filters the PFD's output control signal. The filtered output from the LP 154 is an analog voltage that is used by the VCO 156 to control the frequency of CLKOUT. The APLL 150 implements a control loop in which CLKOUT is fed back to the PFD 152 via frequency divider 158 and a voltage is generated to adjust the frequency of CLKOUT. As such, the frequency of CLKOUT is continually adjusted, as necessary, to maintain phase lock.

The TDC 112 of the DPLL 110 determines the phase difference between the reference clock (REF) selected by the multiplexer 102 and another feedback clock (FBCLK2). FBLCK2 is also derived from CLKOUT via frequency divider 116, which may have the same or different divide ratio as the programmable frequency divider 158. Frequency divider 116 may have a fixed divide ratio (i.e., not programmable) or a programmable divide ratio (programmable). The TDC 112 generates a digital correction word 113 corresponding to the phase error between the selected reference clock (REF) and FBCLK2. The correction word 113 is filtered by DLF 114 and the frequency control word 115 of DLF 114 is used to control the divide ratio of the programmable frequency divider 158 within the APLL 150.

The example PLL architecture of FIG. 1 operates in a two-loop mode. After power-on reset and initialization, the APLL 150 locks the VCO output (CLKOUT) to XO CLK and operates in a "free-run" mode meaning that CLKOUT is not locked to REF and the PLL at this point is not operating to attempt to lock CLKOUT to REFCLK. Then, once the reference clock is selected by the multiplexer 102 and supplied to TDC 112, the DPLL 110 enters a lock acquisition mode. The TDC 112 compares the phase of REF to the phase of FBCLK2 and generates the digital correction word 113. Momentarily ignoring the adder circuit 118 and the averager circuit 125, after filtering of the digital correction word 113 by DLF 114, the frequency control word 115 can be used to control the divide ratio of the programmable frequency divider 158. The control loop implemented by the DPLL 110 results in phase-lock of CLKOUT to REF.

The adder circuit 118 and the averager circuit 125 comprise the circuit mentioned above that causes the PLL to avoid a sharp change in the frequency and phase of CLKOUT upon a change in reference clocks. The averager circuit includes an input that is coupled to an output of the TDC 112, and includes an output that is coupled to an input of the adder circuit 118. Another input of the adder circuit is coupled to the output of the TDC 112. The output of the adder circuit 118 is coupled to an input of the DLF 114. The DLF 114 filters the output values from the adder circuit 118 and controls the divide ratio of the frequency divider 158 within the APLL 150 as described above.

The FSM 170 asserts an average circuit control signal (AVE CTL) to the averager circuit. Following a power-on reset event of the PLL 100, AVE CTL is asserted to a state that disables the averager circuit 125 or otherwise causes its output to be zero. In this configuration (averager circuit 125 disabled), the adder circuit 118 provides the TDC's output values to the DLF 114. The TDC's output values encode the phase difference between REF and FBCLK2. During a locking process, the TDC 112 repeatedly provides updated output values through the adder circuit 118 to the DLF 114. Based on the TDC's output values, the DLF 114 generates frequency control words 115 to control the operation of the APLL 150 and thus control the frequency of CLKOUT.

During operation of the PLL 100, it may become necessary to change the reference clock (REF) to a new reference clock (e.g., change from REF1 to REF2), either due to ERROR signals from the clock invalidity detector circuits 104, based on an externally-supplied multiplexer control signal, or through another mechanism. A chain of events takes place when switching from one reference clock to another, and the order of events described below can vary as desired. The FSM 170 asserts a FREEZE control signal 171 to the DLF 114. FREEZE 171 causes the frequency control word 115 generated by the DLF 114 to be "frozen" (e.g., maintained in a fixed state). Thus, the DLF 114 at this point continues to provide the same frequency control word to the frequency divider 158 of the APLL 150. Further, the multiplexer 102 is reconfigured to select a new reference clock to the TDC 112. The FSM 170 can reconfigure the multiplexer 102 via the REF CTL signal or an externally-supplied control signal to the multiplexer 102 can do the same thing.

At this point, a new reference clock is provided to the input of the TDC 112, but due to the DLF 114 being frozen, FBCLK2 remains at the same frequency and phase as it was prior to the new reference clock being selected through multiplexer 102. Thus, the TDC 112 continues to generate output values but the output values are now a function of the phase difference between the newly selected reference clock and CLKOUT (via FBCLK2) which has been frozen.

The FSM 170 also asserts the AVE CTL signal to the averager circuit 125 to enable the average circuit (if it was previously disabled) and reset it to begin determining an average of the TDC's currently generated values (which are now based on the newly selected reference clock). The averager circuit 125 computes the average of the TDC's output values over a predetermined period of time, and the predetermined period of time may be designed into the averager circuit 125 itself or into the FSM 170 (which asserts a control signal (e.g., AVE CTL) to stop the averaging process). In one example, the average is determined using eight consecutive TDC output values. The resulting average value is stored (e.g., a register, memory, etc.) and provided to the adder circuit 118. As shown in FIG. 1, the averager circuit's output value is negated and added to the currently generated values from the TDC 112. Alternatively stated, the adder circuit 118 subtracts the averager circuit's average value from the TDC's currently generated output values to produce the adder circuit output value to the DLF 114. All references herein to the average value being subtracted from the TDC's output value includes the adder circuit being implemented as an adder with the average value input being negated, or the adder circuit 118 can be implemented as a subtractor.

To summarize, upon switching to a new reference clock, new average value is computed by the averager circuit 125 and the adder circuit's output value to the DLF 114 is the current TDC output values minus the average value. The adder circuit's output values will be approximately equal to 0 which is processed by the DLF 114 as if a phase-lock condition is present. Once the average value is determined, the FSM 170 releases the DFL 114 from its frozen state by, for example, asserting FREEZE 171 to a different logic state. At that point, the DLF 114 is permitted to once again dynamically generate frequency control words 115 to the APLL 150 and the newly generated frequency control words are based on the adder circuit's output which is approximately 0. By forcing the input to the DLF 114 to be approximately causes the PLL 100 to operate as if CLKOUT is phase-locked to the newly selected reference clock. By subtracting the average of the TDC's output values from the TDC's currently generated values causes CLKOUT to be phase-locked to an offset of the newly selected clock, however, in many applications phase-lock to an offset of a reference clock is acceptable.

FIG. 2 illustrates the DLF 114 and how the DLF's operation can be frozen. The DLF includes filter core 204 having a clock input 203. A filter clock is used to clock the filter core 204. The filter clock is provided to one input of an AND gate 202. Another input of the AND gate 202 receives the FREEZE signal 171 from the FSM 170. The AND gate thus gates the filter clock from reaching filter core 204 upon FREEZE being a logic low. Of course, if FREEZE is to be asserted logic high to freeze the DLF 114, an inverter can be included on the input of AND gate to invert the logic state of FREEZE 171.

FIG. 3 shows an example implementation of averager 125. In this example, the averager circuit 125 includes a subtractor 302, an amplifier 304, a summer 306, and a unit-sample delay 308. The gain of the amplifier 304 is less than 1 and thus functions as an attenuator. The subtractor 302 subtracts the output Y from the input X. The amplifier 304 produces an output that is 2^N times the output of the subtractor, where N represents a programmable attenuation value. The amplifier 304 will attenuate the output of the subtractor 302 by a programmable power (N) of 2. Thus, the gain of the amplifier is K, where K=1/G and G=2^N. K is a divide operation. In some digital cases, a divide truncates the remainder fraction if it is not divisible into an integer number. In the disclosed examples, the fraction is maintained meaning that the output of the divider and summer will carry two values—one being the integer portion and the other being the fractional portion. The summer 306 adds the output of the amplifier 304 to Y and the unit-sample delay 308, which is implemented as a register, is used to store the sum of the current averaged output with the attenuated error. Overall, the transfer function implemented by the averager circuit 125 is:

$$\frac{Y}{X} = \frac{K * z^{-1}}{1 + z^{-1}(K-1)}$$

If Y is to be the filtered averaged value of X, then the output of subtractor 302 is the error or difference between the input and output. The output of amplifier 304 will be the attenuated error. The attenuated error is added to the current output by summer 306 to generate a new output. For a constant input X, the output Y will slowly approach X based on the programmable attenuation. If noise is present on X, the output Y will be the average of X or a filtered average of X.

Figure 4:
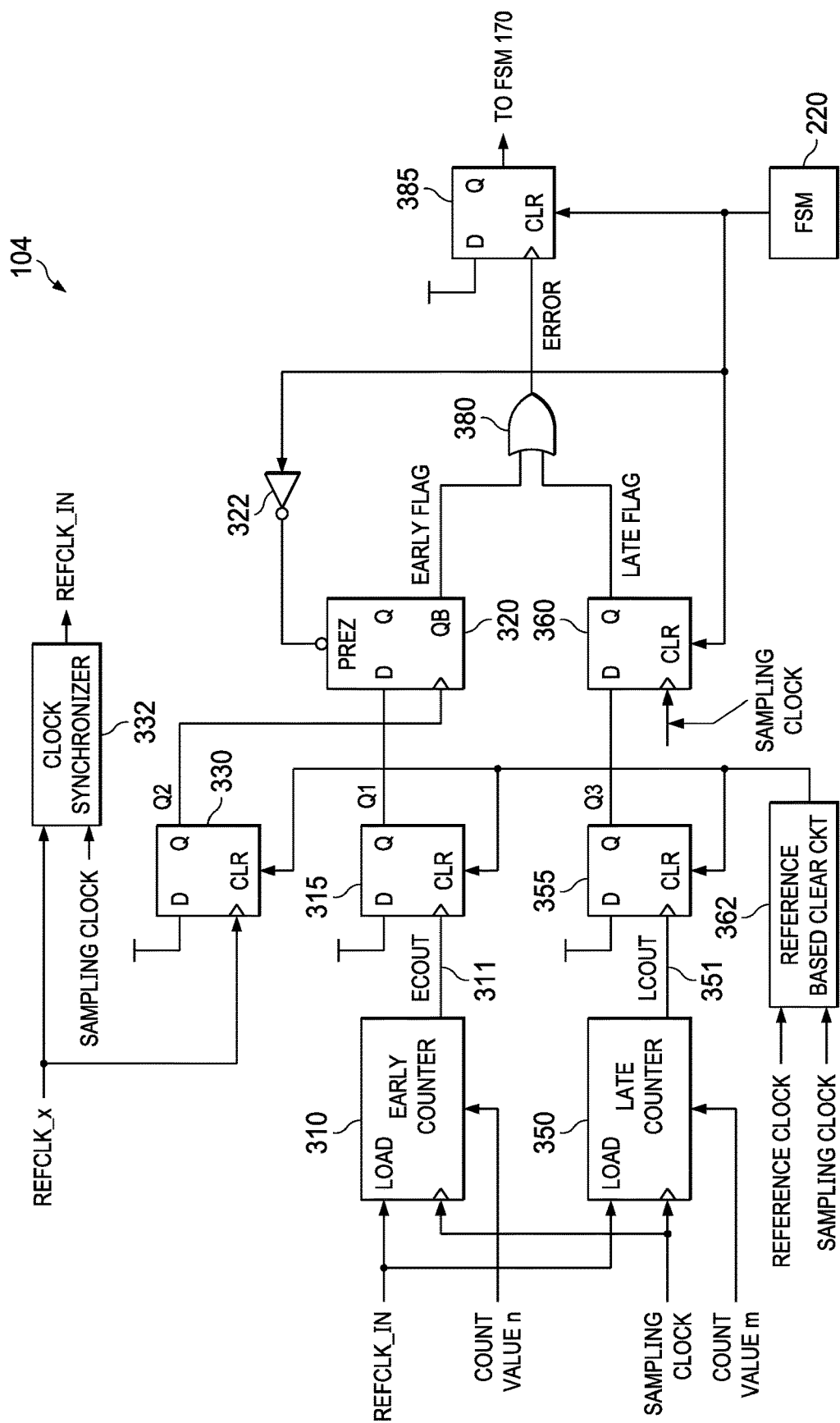
FIG. 4 shows an example of a circuit to detect an invalid reference clock.

FIG. 4 provides an example implementation of a clock invalidity detector circuit 104. This example implementation includes an early counter 310, a late counter 350, flip-flops 315, 320, 330, 355, 360, and 385, inverter 322, OR gate 380, clock synchronizer 332, and reference-based clear circuit 362. A sampling clock is provided to clock the early counter 310 and the late counter 350. The sampling clock is derived from a high frequency oscillator and then divided down to a suitable sampling frequency, which is greater than the frequency of the reference clock, REFCLK_x in this example which corresponds to REF1, REF2, etc. The clock synchronizer circuit 332 synchronizes REFCLK_x to the sampling clock and may include one or more flip-flops for this purpose. The output from the clock synchronizer is labeled as REFCLK_IN, which is provided to the load inputs of the early and late counters 310, 350.

Assertion of load input (e.g., a rising edge of REFCLK_IN) causes each counter 310, 350 to reset itself to an initial count value and to begin counting pulse of the sampling clock. The initial count value is set to be different between the two counters so as to implement a late window that is longer than an early window. The count value for the early counter 310 is shown as "n" and for the late counter 350 is shown a "m". The value m is larger than the value n in this example.

In the example of FIG. 4, the counters 310, 350 are count-down counters in that, following a reset event, each counter starts counting down from its programming count value (n or m as shown) to zero. The output of each counter 310, 350 is low while counting down until the terminal value (0) is reached, at which point the output is asserted high. That is, when the early counter 310 reaches 0, its output 311 (labeled as early counter output, ECOUT) is asserted. Similarly, when the late counter 350 reaches 0, its output 351 (labeled as late counter output, LCOUT) is asserted. The output 311 of early counter 311 is provided to the clock input of flip-flop 315 and the output 351 of late counter 350 is provided to the clock input of flip-flop 355. The data (D) inputs of both flip-flops 315 and 355 are tied to a logic high level. Thus, if and when the early counter 310 reaches 0, its output transitions from low to high thereby clocking a logic high on the Q output (labeled as Q1) of flip-flop 315. Similarly, if and when the late counter 350 reaches 0, its output transitions from low to high thereby clocking a logic high on the Q output (labeled as Q3) of flip-flop 355.

The Q outputs of flip-flops 315 and 355 are provided to the data inputs of flips-flops 320 and 360, respectively. The sampling clock is used to clock flip-flop 360. Flip-flop 320 is clocked by the Q output (labeled as Q2) of flip-flop 330.

The Q bar (QB) output of flip-flop 320 is a signal labeled as EARLY FLAG. Flip-flop 330 is clocked by REFCLK_x. The Q output of flip-flop 360 is a signal labeled as LATE FLAG. Absent an early reference clock, the QB output (EARLY FLAG) of flip-flop 320 is logic low. Similarly, absent a late reference clock, the Q output (LATE FLAG) of flip-flop 360 also is logic low. The data input of flip-flop 330 is tied to a logic high. The Q output of flip-flop 330 transitions from low to high upon a rising edge of REFCLK_X. Flip-flop 330 is used to introduce a small time delay so that a subsequent edge of REFCLK_x is used to clock flip-flop 330 from the edge of REFCLK_x (REFCLK_IN) that resets the early counter 310.

OR gate 380 is coupled to the QB output of flip-flop 320 and the Q output of flip-flop 360 to logically OR together EARLY FLAG and LATE FLAG to generate an ERROR signal. Flip-flop 385 functions as a latch to hold ERROR on its Q output to the FSM 220. The ERROR signal to the FSM 220 can be either the output of OR gate 380 or the latched output from flip-flop 385.

The following discussion explains the operation of the early window to detect an early reference clock. For the early reference clock detection, while early counter 310 is counting down, but before its terminal count is reached, the output 311 of the early counter is 0 and the Q output of flip-flop 315 is 0. Flip-flop 320 has been preset by the output of inverter 322 (via FSM 220) and thus its QB output (EARLY FLAG) is logic 0. Upon occurrence of an early reference clock (i.e., a reference clock rising edge that occurs after the early counter 310 has been reset and is counting down but before the early counter 310 reaches 0), flip-flop 330 is clocked thereby forcing its Q output to transition from low to high and clocking flip-flop 320. Flip-flop 320 at this point is clocked with its D input being 0 which then causes EARLY FLAG to transition to a high logic level and ERROR is asserted high via OR gate 380.

The following discussion explains the operation of the late window to detect a late reference clock. For the late reference clock detection, while late counter 350 is counting down, but before its terminal count is reached, the output 351 of the late counter is 0 and the Q output of flip-flop 315 is 0. Flip-flop 360 has been cleared by the FSM 220, and thus its Q output (LATE FLAG) is logic 0. Once the late counter 350 counts down to 0, flip-flop 355 is then clocked thereby forcing the Q output of flip-flop 355 to a logic high level, which in turn forces the Q output of flip-flop 360 (LATE) FLAG to become logic high upon the next rising edge of the sampling clock. OR gate 380 then causes its ERROR output signal to become logic high in response to LATE FLAG being high. Had the next rising edge of REFCLK_x occurred before the late counter 350 expired, the late counter 350 would have been reset by the REFCLK_x edge and not permitted to count down to 0. The reference-based clear circuit 362 generates a clear signal to clear flip-flops 330, 315 and 355 responsive to either each rising edge of REFCLK_IN or the sampling clock.

The example of FIG. 1 functions well assuming the PLL 100 had achieved phase lock to the reference clock before the change in reference clocks was implemented. If phase lock had occurred, the TDC's output values would have been approximately 0 and thus subtracting the average of new TDC's output values from the new TDC output values (following a change in reference clock) also results in a 0 value to the DLF 114.

Figure 5:
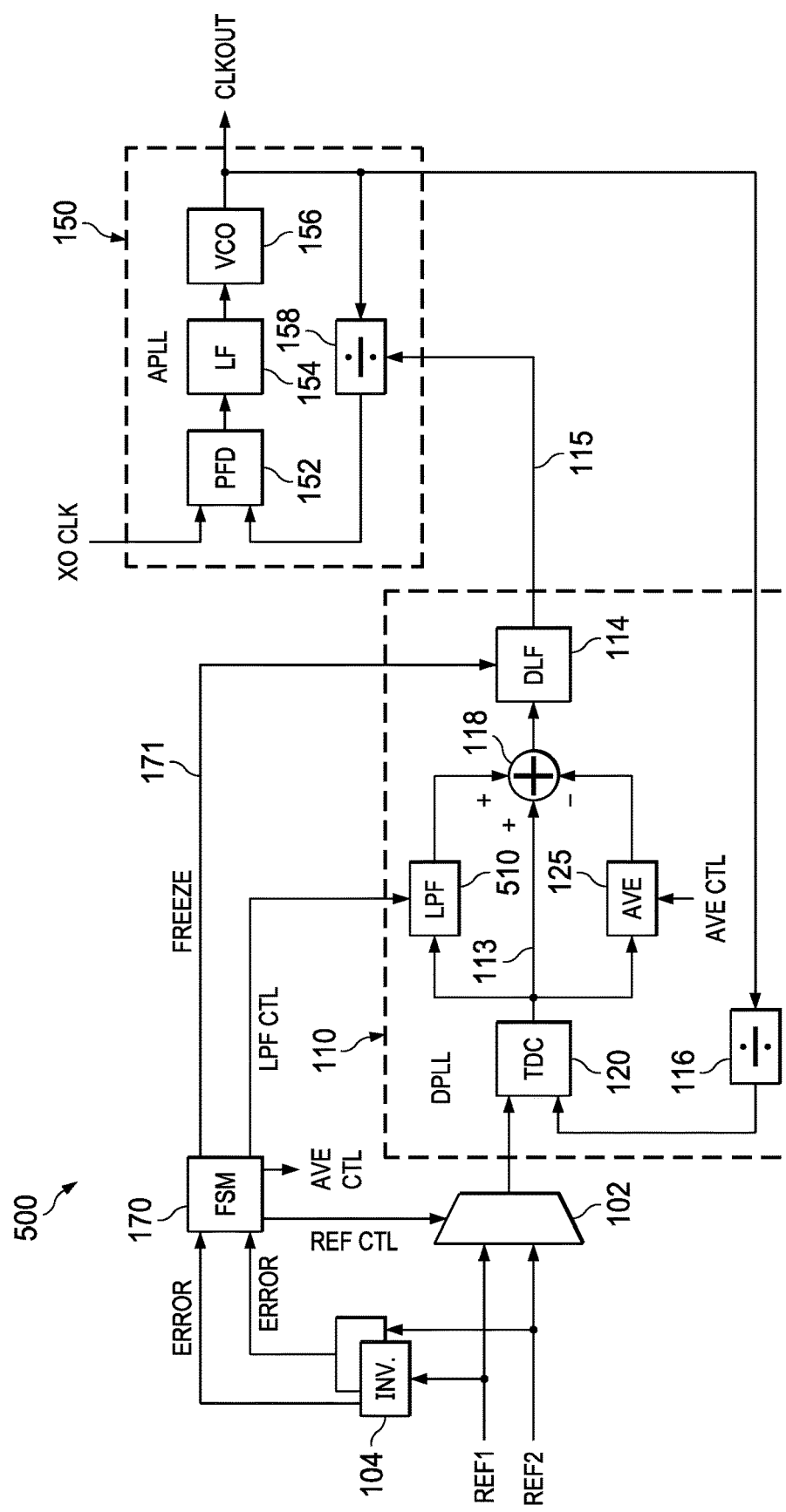
FIG. 5 shows an alternative example of a PLL.

However, it is possible that phase lock was not achieved when the change in reference clocks occurs. FIG. 5 is an example of a PLL 500 with much the same circuit structure as PLL 100 in FIG. 1, but with a difference that accounts for phase lock not having been achieved upon a change in the reference clock. The difference for PLL 500 is the addition of filter 510, which in one example includes a low pass filter. Low pass filter 510 filters the TDC's output values and stores the low pass filtered result (e.g., in a register, memory, etc.). The LPF 510 thus generates a filtered value of the TDC's output values before the change in reference clock, while the averager circuit 125 generates an average of the TDC's output values after the change in reference clock. A control signal (LPF CTL) from the FSM 170 causes the LPF to save its output to memory. Upon a change in reference clock, the FSM asserts LPF CTL to cause the LPF to save its output which had been determined based on the former reference clock. The stored filtered output value thus represents the state of the TDC output value pursuant to the old reference clock (which will be 0 if phase lock had occurred or will not be 0 if phase lock had not been achieved).

The adder circuit 118 subtracts the newly calculated average value (calculated using TDC output values based on a new reference clock) from the current TDC output values, as well as adds in the low pass filtered stored value (which was determined using the previous reference clock). The resulting adder circuit output is thus the sum of the LPF's stored value and the current TDC output 113 less the average value from the averager circuit. The PLL 500 of FIG. 5 otherwise works the same as described above with respect to the PLL 100 of FIG. 1.

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A phase-locked loop (PLL), comprising:
   a multiplexer with multiple inputs, each input coupled to receive a different reference clock;
   a time-to-digital converter (TDC) to generate a TDC output value based on a phase difference between a reference clock from the multiplexer and a feedback clock;
   an averager circuit coupled to an output of the TDC;
   an adder circuit coupled to outputs of the TDC and the averager circuit;
   a loop filter coupled to an output of the adder circuit;
   wherein the averager circuit includes an enable input and wherein, upon a power-on reset event, the averager circuit's enable input is to receive a control signal to disable the averager circuit.

2. A phase-locked loop (PLL), comprising:
   a multiplexer with multiple inputs, each input coupled to receive a different reference clock;
   a time-to-digital converter (TDC) to generate a TDC output value based on a phase difference between a reference clock from the multiplexer and a feedback clock;
   an averager circuit coupled to an output of the TDC;
   an adder circuit coupled to outputs of the TDC and the averager circuit;
   a loop filter coupled to an output of the adder circuit;
   wherein, upon a power-on reset event, an output of the adder circuit is the TDC output value.

3. A phase-locked loop (PLL), comprising:
a multiplexer with multiple inputs, each input coupled to receive a different reference clock;
a time-to-digital converter (TDC) to generate a TDC output value based on a phase difference between a reference clock from the multiplexer and a feedback clock;
an averager circuit coupled to an output of the TDC;
an adder circuit coupled to outputs of the TDC and the averager circuit;
a loop filter coupled to an output of the adder circuit;
wherein the loop filter is configured into a frozen state in which an output frequency control word from the loop filter is to be frozen upon the multiplexer being reconfigured to select a different reference clock while the averager circuit is determining an average of the TDC's output values.

4. The PLL of claim 3, wherein the loop filter is to be configured into the frozen state for a predetermined period of time after which the loop filter is reconfigured out of the frozen state to permit the loop filter to determine new output frequency control words.

5. A phase-locked loop (PLL), comprising:
a multiplexer with multiple inputs, each input coupled to receive a different reference clock;
a time-to-digital converter (TDC) to generate a TDC output value based on a phase difference between a reference clock from the multiplexer and a feedback clock;
an averager circuit coupled to an output of the TDC;
an adder circuit coupled to outputs of the TDC and the averager circuit;
a loop filter coupled to an output of the adder circuit; and
a second filter coupled to the output of the TDC, the second filter having an output coupled to an input of the adder circuit;
wherein:
upon reconfiguring the multiplexer to select a different reference clock to provide to the TDC, the loop filter is configured into a first state in which an output frequency control word from the loop filter is to remain fixed;
the averager circuit is to determine an average of multiple TDC output values; and
the adder circuit is to generate an output value that is the current TDC output value plus the output of the second filter and minus the average determined by the averager circuit.

6. A phase-locked loop (PLL), comprising:
a multiplexer with multiple inputs, each input coupled to receive a different reference clock;
a time-to-digital converter (TDC) to generate a TDC output value based on a phase difference between a reference clock from the multiplexer and a feedback clock;
an averager circuit coupled to an output of the TDC, the averager circuit to determine an average of multiple TDC output values to produce an average value;
an adder circuit coupled to outputs of the TDC and the averager circuit, the adder circuit to subtract the average value from current TDC output values to produce adder circuit output values; and
a digital loop filter coupled to an output of the adder circuit to filter the adder circuit output values;
wherein, upon configuring the multiplexer to provide a different reference clock to the TDC, the averager circuit is to determine the average value and the digital loop filter's output is to be maintained at a fixed output value;
wherein:
the digital loop filtered is configured to maintain its output value at the fixed output value upon the multiplexer being configured to provide the different reference clock;
based on a predetermined time period after configuring the multiplexer to provide the different reference clock, reconfiguring the digital loop to filter to cause the output values from the digital loop filter to be dynamically generated by the digital loop filter based on the adder circuit output value.

7. A phase-locked loop (PLL), comprising:
a multiplexer with multiple inputs, each input coupled to receive a different reference clock;
a time-to-digital converter (TDC) to generate a TDC output value based on a phase difference between a reference clock from the multiplexer and a feedback clock;
an averager circuit coupled to an output of the TDC, the averager circuit to determine an average of multiple TDC output values to produce an average value;
an adder circuit coupled to outputs of the TDC and the averager circuit, the adder circuit to subtract the average value from current TDC output values to produce adder circuit output values; and
a digital loop filter coupled to an output of the adder circuit to filter the adder circuit output values;
wherein, upon configuring the multiplexer to provide a different reference clock to the TDC, the averager circuit is to determine the average value and the digital loop filter's output is to be maintained at a fixed output value; and
a second filter coupled to the output of the TDC, the second filter having an output coupled to an input of the adder circuit;
wherein the adder circuit is to subtract the average value from current TDC output values and also to add an output value from the low pass filter to produce the adder circuit output values.

8. A phase-locked loop (PLL), comprising:
a multiplexer with multiple inputs, each input coupled to receive a different reference clock;
a time-to-digital converter (TDC) to generate a TDC output value based on a phase difference between a reference clock from the multiplexer and a feedback clock;
an averager circuit coupled to an output of the TDC, the averager circuit to determine an average of multiple TDC output values to produce an average value;
an adder circuit coupled to outputs of the TDC and the averager circuit, the adder circuit to subtract the average value from current TDC output values to produce adder circuit output values; and
a digital loop filter coupled to an output of the adder circuit to filter the adder circuit output values;
wherein, upon configuring the multiplexer to provide a different reference clock to the TDC, the averager circuit is to determine the average value and the digital loop filter's output is to be maintained at a fixed output value; and
further comprising an analog phase-locked loop including a frequency divider, wherein frequency control words from the digital loop filter are to control a divide ratio of the frequency divider.

9. A method, comprising:
causing a frequency control word output from a digital loop filter to remain fixed;

changing an input to a time-to-digital converter (TDC) from a first reference clock to a second reference clock;

determining an average of output values from the TDC to generate an average value;

generating a second value based on the average value and the current TDC output values; and causing the digital loop filter to dynamically generate new frequency control words based on the second value;

further comprising low pass filtering the TDC output values before changing the TDC input to the second reference clock to produce a low pass filtered output, and wherein generating the second value comprises generating the second value based on the average value, the current TDC output values, and the low pass filtered output.

10. The method of claim 9, wherein generating the average of the TDC output values comprises generating the average for a predetermined number of clock cycles.

11. A method, comprising:

causing a frequency control word output from a digital loop filter to remain fixed;

changing an input to a time-to-digital converter (TDC) from a first reference clock to a second reference clock;

determining an average of output values from the TDC to generate an average value;

generating a second value based on the average value and the current TDC output values; and causing the digital loop filter to dynamically generate new frequency control words based on the second value;

wherein determining the average of output values from the TDC comprises determining the average of the TDC's output values after changing to the second reference clock.

* * * * *